United States Patent [19]

Yamazaki et al.

[11] Patent Number: 5,106,011
[45] Date of Patent: Apr. 21, 1992

[54] BUMP ATTACHMENT METHOD

[75] Inventors: Nobuto Yamazaki; Koji Sato, both of Tokyo, Japan

[73] Assignee: Kabushiki Kaisha Shinkawa, Tokyo, Japan

[21] Appl. No.: 637,179

[22] Filed: Jan. 3, 1991

[30] Foreign Application Priority Data

Jan. 4, 1990 [JP] Japan .......................... 2-26

[51] Int. Cl.⁵ ............................................ B23K 31/02
[52] U.S. Cl. ................................. 228/253; 228/56.3
[58] Field of Search ...................... 228/179, 180.2, 253, 228/254, 255, 56.3

[56] References Cited

U.S. PATENT DOCUMENTS

| | | | |
|---|---|---|---|
| 3,472,365 | 10/1969 | Tiedma | 228/56.3 |
| 4,142,662 | 3/1979 | Holbrook et al. | 228/253 |
| 4,832,255 | 5/1989 | Bickford et al. | 228/56.3 |
| 4,892,245 | 1/1990 | Dunaway et al. | 228/180.2 |

*Primary Examiner*—Samuel M. Heinrich
*Attorney, Agent, or Firm*—Koda and Androlia

[57] ABSTRACT

In a method for bonding bumps to leads by pressing leads installed on a carrier tape against bumps formed on a substrate, corresponding lead-bump pairs are individually bonded; particularly, one lead on the carrier and one bump on the substrate are first aligned, and then other pairs of leads and bumps are successively and individually bonded, thus performing a secure and uniform bonding action without necessity of alterations to the bumps.

3 Claims, 3 Drawing Sheets

BUMP ATTACHMENT METHOD

BACKGROUND OF THE INVENTION

1. Field of the Invention

The present invention relates to a bump attachment method for bonding bumps to leads formed on a carrier tape.

2. Prior Art

Publications such as Japanese Patent Application Publication (Kokoku) Nos. 62-31819 and 62-34142 and Japanese Patent Application Laid-Open Publication (Kokai) No. 59-139635, etc. disclose methods for attaching bumps to leads provided on a carrier tape.

Such bump attachment methods are performed by means of a bonding apparatus such as that shown in FIGS. 5 through 7.

As seen in FIG. 5, a plurality of leads 2 (see FIG. 7) are formed in a given order on a carrier tape 1 made of a polyamide film, etc. This carrier tape 1 is supplied from a supply reel (not shown) and wound around a take-up reel (not shown) after passing through a first tape clamper 3, a bonding guide 4 and a second tape clamper 5. A tool 6, positioned above the bonding guide 4, is caused to move in the vertical direction (Z direction) and in the horizontal direction (X and Y directions) by a driving means (not shown). This tool 6 passes through a bonding window 4a formed at the center of the bonding guide 4. A camera 7 is installed above the bonding window 4a and detects the leads 2 on the carrier tape 1 and the bumps 13.

Installed beneath the bonding guide 4 is a bonding stage 10. This bonding stage 10 is moved in the horizontal direction (X and Y directions) and vertical direction (Z direction) and also rotated ($\theta$ direction) by a driving means (not shown). The bonding stage 10 has a vacuum chuck 11 on its upper end so that a substrate 12 made of glass, etc. is held (via suction force) by this vacuum chuck 11. As shown in FIG. 6, bumps 13 are formed on a substrate 12 at a fixed pitch in the lateral and longitudinal directions in device patterns 14a, 14b, ... so that each of them corresponds to the leads 2 of one device pattern formed on the carrier tape 1.

A method for attaching bumps using the apparatus thus constructed will be described below. Since the leads 2 on the carrier tape 1 are omitted from FIG. 6, reference should be made to FIG. 7 whenever the leads 2 are mentioned.

The carrier tape 1 is fed when the tape clampers 3 and 5 are opened, and the leads 2 that are to be bonded are positioned under the bonding window 4a. Then, the tape clampers 3 and 5 are closed so that the carrier tape 1 is held securely. The positions of the leads 2 are detected by the camera 7 and stored in an arithmetic unit (not shown). The tape clampers 3 and 5 and the bonding guide 4 are moved in the X and Y directions so as to eliminate any discrepancy in the lead positions stored in the arithmetic unit. Thus, the horizontal positional discrepancy is corrected. Then, the bonding stage 10 is moved in the X and Y directions so that the bumps 13 in the device pattern 14a are positioned to correspond to the leads 2.

Next, the tool 6 is moved in the X and Y directions and lowered so that the leads 2 are pressed against the bumps 13 as shown in FIG. 7. As a result, the bumps 13 in the device pattern 14a are bonded as a group to the leads 2.

Afterward, the tool 6 is raised and moved in the X and Y directions, and then, the carrier tape 1 is fed a fixed distance so that the leads 2 in the next device pattern to be bonded are positioned beneath the bonding window 4a. The device pattern 14b that is to be bonded next is fed and positioned beneath the leads 2. Then, the action described above is repeated so that the bumps 13 in the device pattern 14b are bonded as a group to the leads 2.

In the prior art described above, since one device pattern consisting of leads 2 and one device pattern consisting of bumps 13 are aligned and then the leads and bumps are bonded as a group, the following problems arise:

Bonding is performed in groups. As a result, variations in the inclination of the tool 6 with respect to the bonding surface or in the thickness of the individual leads 2 and bumps 13, etc. may make it difficult to achieve uniform pressure bonding of the individual leads 2 and bumps 13 within the device patterns. Also, it is necessary that the bumps 13 be arranged on the substrate 12 in accordance with the arrangement of the leads 2. Moreover, in cases where defects occur within the device patterns (e.g., positional discrepancies of bumps, missing of bumps, presence of unnecessary bumps, etc.), the device patterns 14a, 14b ... become unusable, resulting in that the yield drops.

SUMMARY OF THE INVENTION

Accordingly, the first object of the present invention is to provide a bump attachment method which is free of defective bonding.

The second object of the present invention is to provide a bump attachment method in which the bumps on a substrate can be used without alteration even when the arrangement of the leads on the carrier tape varies.

The third object of the present invention is to provide a bump attachment method which offers an improved yield.

The first object of the present invention is achieved by bonding corresponding lead-bump pairs individually.

The first through third objects of the present invention are achieved by first aligning one lead and one bump and then successively repeating the action which bonds the lead-bump pairs for all of the leads.

Since the corresponding lead-bump pairs are individually bonded, bonding conditions such as bonding load, bonding time, etc. can be individually set, eliminating defective bonding.

Thus, by aligning one lead and one bump and then successively repeating the bonding action onto the lead-bump pairs for all of the leads, it is possible to use the bumps on the substrate without alteration even if the arrangement of the leads on the carrier tape should vary. Moreover, in cases where defective bumps are present, such bumps can be skipped so that only good bumps are bonded. Thus, the yield can be improved.

DETAILED DESCRIPTION OF THE INVENTION

Figure 1:
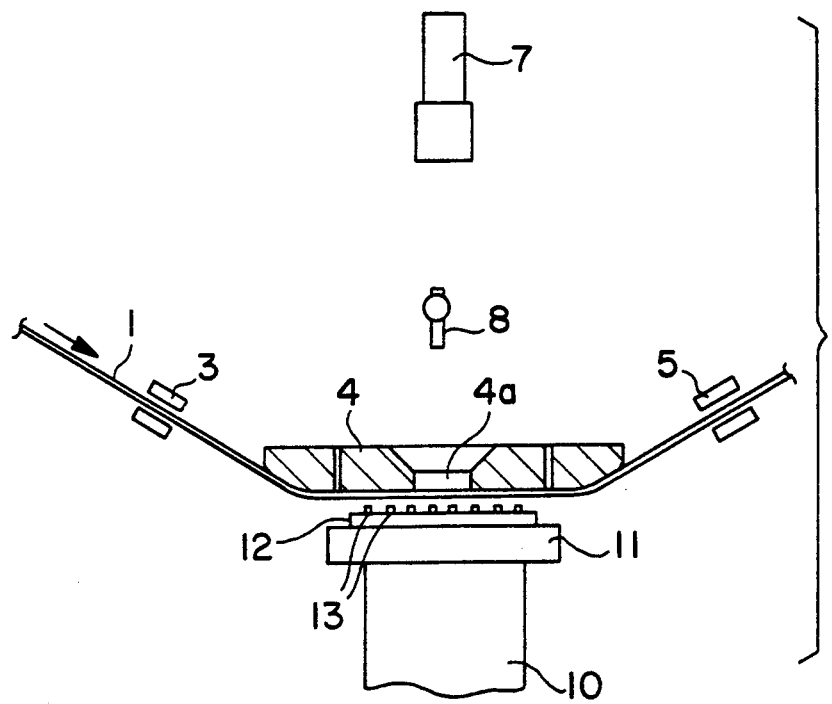
FIG. 1 is a schematic front view of the bonding apparatus used in the method of the present invention.
Figure 2:
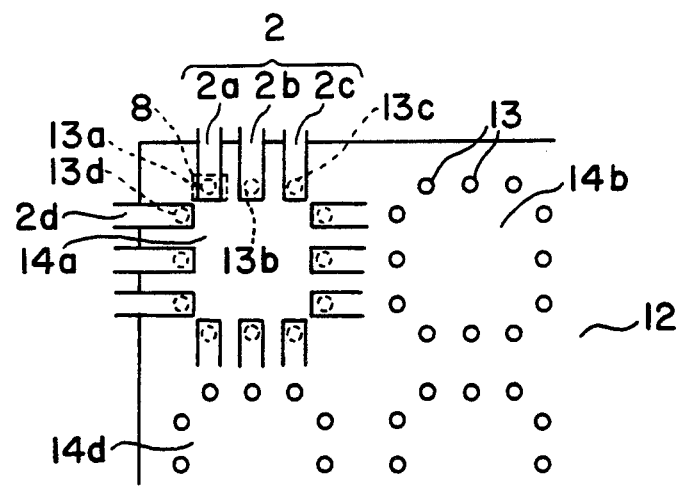
FIG. 2 is a plan view which illustrates one embodiment of the method of the present invention.
Figure 5:
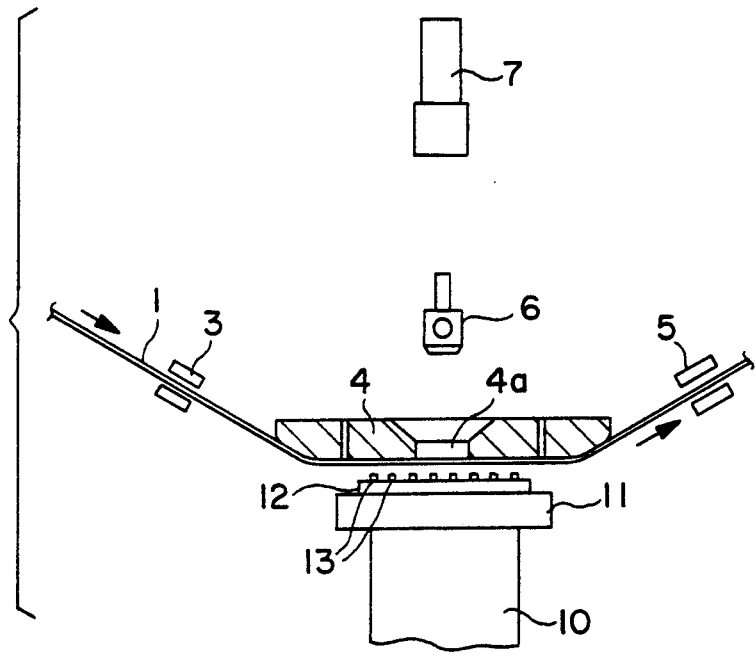
FIG. 5 is a schematic front view of a conventional bonding apparatus.
Figure 6:
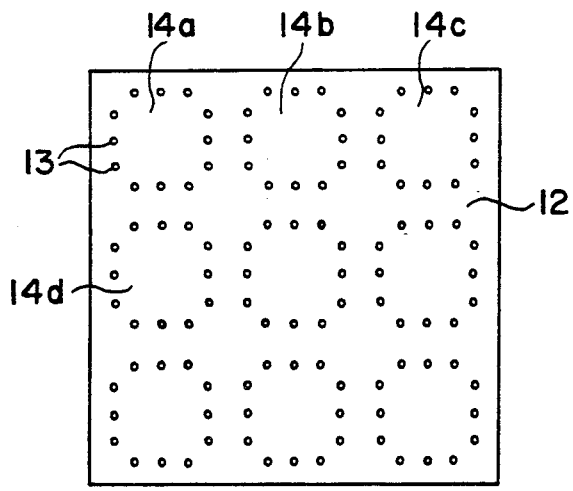
FIG. 6 is a plan view showing an arrangement of bumps on a substrate.
Figure 7:
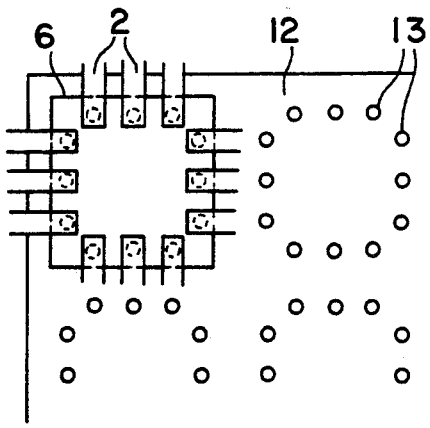
FIG. 7 is a plan view illustrating a conventional method.

One embodiment of the present invention will be first described with reference to FIGS. 1 and 2 together with FIG. 6. Elements which are the same as in FIGS. 5 and 7 are labeled with same reference numerals, and a description of such elements is omitted. The tool used in this embodiment is of sufficient size for bonding one lead. Also, the description will be made on the method in which bump attachment is performed using a substrate on which bumps are formed in device patterns as shown in FIG. 6.

As in conventional methods, the carrier tape 1 is first fed out when the tape clampers 3 and 5 are opened, and the leads 2 that are provided on the carrier tape 1 and to be bonded are positioned below the bonding window 4a. The tape clampers 3 and 5 are closed so that the carrier tape 1 is securely held. The positions of the leads 2 are detected by the camera 7, and the lead positions are stored in the arithmetic unit (not shown). The tape clampers 3 and 5 and the bonding guide 4 are moved in the X and Y directions in accordance with any discrepancy in the lead positions stored in the arithmetic unit. The positional discrepancy is thus corrected. The bonding stage 10 is moved in the X and Y directions so that the bumps 13 in the device pattern 14a are positioned to correspond to the leads 2 as shown in FIG. 2.

The tool 8 is driven in the X and Y directions so that it is moved to a position above the 2a. The tool 8 is then lowered, and the lead 2a is pressed against the bump 13a, thus bonding being performed between the bump 13a and the lead 2a. Afterward, the tool 8 is raised and driven in the X and Y directions so that the tool 8 is moved to a position above the lead 2b. The tool 8 is then lowered, and the lead 2b is pressed against the bump 13b, thus bonding the lead 2b and bump 13b together. Afterward, corresponding leads 2 and bumps 13, i.e., 2c and 13c, 2d and 13d, and so on, are individually and successively bonded in the same manner.

When all the bondings between the leads 2 in one device pattern and the bumps 13 in the device pattern 14a has thus been completed, the bonding stage 10 is moved so that the next device pattern 14b is positioned beneath the camera 7. The carrier tape 1 is fed a fixed distance so that the next lead device pattern is positioned beneath the bonding window 4a, and the action described above is repeated so that the bumps 13 are bonded to the leads 2.

Since the corresponding leads 2 and bumps 13 (i.e., 2a and 13a, 2b and 13b, and so on) are individually bonded, bonding conditions (such as bonding load, bonding time, etc.) can be individually set. Thus, defective bonding does not occure. If the tool 8 is attached to an ultrasonic horn, the ultrasonic output can also be individually set.

Another embodiment of the present invention will be described with reference to FIGS. 3 and 4.

Figure 3:
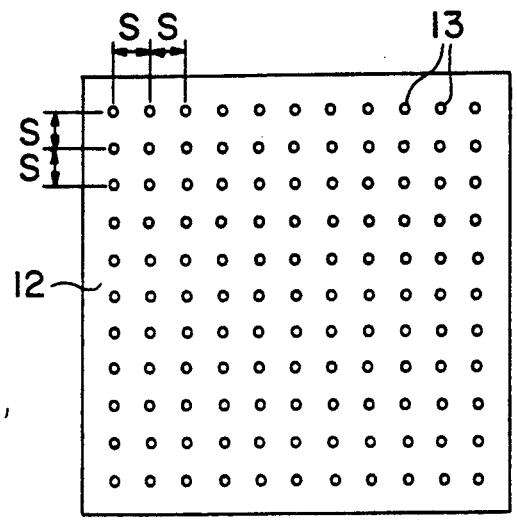
FIG. 3 is a plan view which illustrates the arrangement of the bumps on a substrate used in another embodiment of the present invention.
Figure 4A:
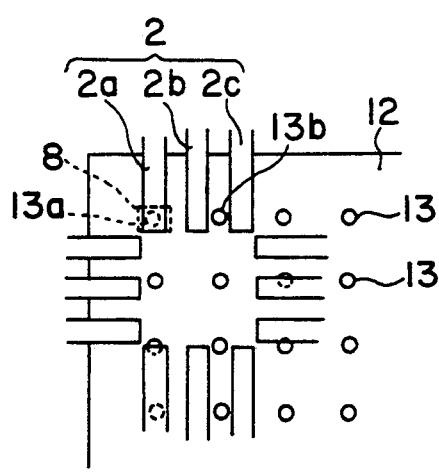
FIGS. 4(a) and 4(b) are plan views which illustrate one embodiment of another method of the present invention.

FIG. 3 shows a substrate 12 on which n×n number of bumps 13 are formed. The bumps are arranged laterally and longitudinally at a fixed pitch S on the substrate 12. A bump attachment method using such a substrate 12 will be described:

As in the embodiment described above, the carrier tape 1 is first fed with the tape clampers 3 and 5 open so that the leads 2 to be bonded are positioned under the bonding window 4a. The tape clampers 3 and 5 are then closed so that the carrier tape 1 is positionally secured. The positions of the leads 2 are detected by the camera 7, and the lead positions are stored in the arithmetic unit (not shown). The tape clampers 3 and 5 and the bonding guide 4 are moved in the X and Y directions in accordance with any discrepancy in the lead positions stored in the arithmetic unit, so that any positional discrepancies are corrected. The bonding stage 10 is moved in the X and Y directions, and the bump 13a is positioned at a position corresponding to the lead 2a as shown in FIG. 4(a).

Figure 4B:
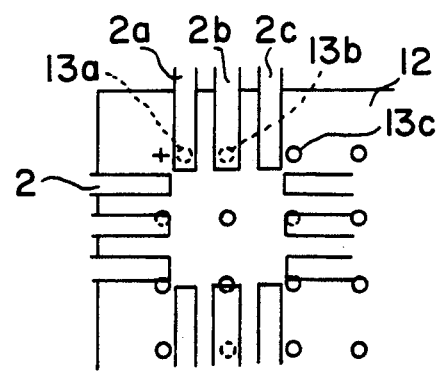

Next, the tool 8 is driven in the X and Y directions and moved to a position above the lead 2a. The tool 8 is lowered so that the lead 2a is pressed against the bump 13a, thus bonding the bump 13a to the lead 2a. Afterward, the tool 8 is moved to a position above the lead 2b. The bonding stage 10 is moved in the X direction so that the bump 13b is positioned beneath the lead 2b. Then, the tool 8 is lowered so that the lead 2b is pressed against the bump 13b as shown in FIG. 4(b). The lead 2b and bump 13b are bonded. Corresponding leads 2 and bumps 13 (i.e., 2c and 13c, 2d, and 13d, and so on) are individually and successively bonded in the same manner thereafter.

When all of the leads 2 in one device pattern are bonded to bumps 13, the carrier tape 1 is fed a fixed distance so that the next device pattern (consisting of leads 2) to be bonded is positioned beneath the bonding window 4a. The bumps 13 that are to be bonded next are fed to a position beneath the leads 2, and the bumps 13 are bonded to the leads 2 by repeating the action described above.

Since the corresponding leads 2 and bumps 13 (i.e., 2a, 13a, 2b, and 13b, and so on) are thus individually bonded, conditions such as the bonding load and bonding time, etc. are individually set as in the embodiment described above. Thus, no defective bonding occurs. Since one lead and one bump are aligned and then the action which bonds the lead and bump is successively repeated for all of the leads 2, the bumps on the substrate can be used without alteration even if the arrangement of the leads on the carrier tape should vary. Moreover, when there are defective bumps on a substrate, such bumps are skipped so that only good bumps are bonded. Accordingly, the yield can be improved.

In the present invention, as is clear from the above description, since corresponding lead-bump pairs are individually bonded, conditions such as bonding load, bonding time, etc. can be individually set, eliminating defective bondings.

By aligning one lead and one bump and then successively repeating the action which bonds the leads and bumps for all of the leads, the bumps on the substrate can be used without alteration even though the arrangement of the leads on the carrier tape should vary. Moreover, in cases where defective bumps are present, such bumps can be skipped so that only good bumps are bonded. Accordingly, the yield can be improved.

We claim:

1. A bump attachment method wherein leads provided on a carrier tape are pressed against individual bumps formed on a substrate so as to bond said individual bumps to said leads, said method being characterized in that corresponding lead-bump pairs are individually bonded.

2. A bump attachment method in which leads provided on a carrier tape are pressed against individual bumps formed on a substrate so as to bond said individual bumps to said leads, said method being characterized in that one lead and one bump are first aligned, and then an action which bonds pairs of leads and bumps are successively performed for all of the leads.

3. A bump attachment method in which leads provided on a carrier tape are pressed against individual bumps formed on a substrate so as to bond said individual bumps to said leads, said method being characterized by the steps of aligning one lead and one bump and individually and successively bonding pairs of said aligned leads and bumps.

* * * * *